United States Patent
Guha et al.

(10) Patent No.: US 8,617,915 B2
(45) Date of Patent: Dec. 31, 2013

(54) ANNEALING THIN FILMS

(75) Inventors: Supratik Guha, Chappaqua, NY (US); David B. Mitzi, Mahopac, NY (US); Teodor K. Todorov, Yorktown Heights, NY (US); Kejia Wang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 95 days.

(21) Appl. No.: 13/153,381

(22) Filed: Jun. 3, 2011

(65) Prior Publication Data

US 2012/0070936 A1    Mar. 22, 2012

Related U.S. Application Data

(60) Provisional application No. 61/384,407, filed on Sep. 20, 2010.

(51) Int. Cl.
  *H01L 21/00* (2006.01)
(52) U.S. Cl.
  USPC .. 438/77; 438/796; 257/E21.459; 257/E21.48
(58) Field of Classification Search
  USPC ............... 257/42, E21.459, E21.48, E21.482, 257/E31.027; 438/77, 796, 797
  See application file for complete search history.

(56) References Cited

U.S. PATENT DOCUMENTS

| | | | |
|---|---|---|---|
| 4,347,263 A * | 8/1982 | Whitehouse | 438/72 |
| 6,500,733 B1 | 12/2002 | Stanbery | |
| 2007/0235653 A1 * | 10/2007 | Buckle et al. | 250/370.08 |
| 2008/0057220 A1 * | 3/2008 | Bachrach et al. | 427/569 |
| 2009/0148669 A1 * | 6/2009 | Basol | 428/189 |
| 2011/0146770 A1 * | 6/2011 | Dieter et al. | 136/255 |
| 2011/0155226 A1 * | 6/2011 | Kusunoki et al. | 136/252 |
| 2011/0287573 A1 * | 11/2011 | Johnson et al. | 438/84 |
| 2012/0055554 A1 * | 3/2012 | Radu et al. | 136/264 |
| 2012/0100660 A1 * | 4/2012 | Hagedorn et al. | 438/63 |

OTHER PUBLICATIONS

Hironori Katagiri, "Cu2ZnSnS4 thin film solar cells". Thin Solid Films 480-481 (2005) 426-432.

Tooru Tanaka, et al. "Fabrication of Cu2ZnSnS4 thin films by co-evaporation" 2006 Wiley-VCH Verlag GmbH & Co. KGaA, Weinheim.

Hironori Katagiri et al. -Enhanced Conversion Efficiencies of Cu2ZnSnS4-Based Thin Film Solar Cells by Using Preferential Etching Technique. 2008 Japan Society of Appl.Phys.

Hironori Katagiri, et al. "Development of CZTS-based thin film solar cells". Thin Solid Films 517 (2009) 2455-2460.

(Continued)

*Primary Examiner* — Caridad Everhart
(74) *Attorney, Agent, or Firm* — Daniel P. Morris; Otterstedt, Ellenbogen & Kammer, LLP

(57) ABSTRACT

In an annealing process, a Kesterite film is provided on a substrate. The Kesterite film and the substrate are generally planar, have an interface, and have a substrate exterior side and a Kesterite exterior side. An additional step includes locating the cap adjacent the Kesterite exterior side. A further step includes applying sufficient heat to the Kesterite film and the substrate for a sufficient time to anneal the Kesterite film. The annealing is carried out with the cap adjacent the Kesterite exterior side. In another aspect, the film is not limited to Kesterite, and the cap is employed without any precursor layer thereon. Solar cell manufacturing techniques employing the annealing techniques are also disclosed.

27 Claims, 7 Drawing Sheets

(56) References Cited

OTHER PUBLICATIONS

Hironori Katagiri, et al. "The influence of the composition ratio on CZTS-based thin film solar cells". Mater. Res. Soc. Symp. Proc. vol. 1165, 2009 Materials Research Soc.

G. Zoppi, et al. "Cu2ZnSnSe4 Thin Film Solar Cells Produced by Selenisation of Magnetron Sputtered Precursors". 2009 John Wiley & Sons, Ltd.

Bjorn-Arvid Schubert, et al. "Cu2ZnSnS4 thin film solar cells by fast coevaporation". 2010 John Wiley & Sons, Ltd.

K. Wang, et al. "Thermally evaporated Cu2ZnSnS4 solar cells". Applied Physics Letters 97, 143508 2010.

"Solar Spectral Irradiance" downloaded from http://rredc.nrel.gov/solar/spectra/am1.5/.

"IBM's Efficient Thin Film Solar Cell Made of Cheap Materials" downloaded from http://www.greenoptimistic.com/2010/02/15/ibms-efficient-thin-film-solar-cell-cheap-materials/.

* cited by examiner

ANNEALING THIN FILMS

CROSS-REFERENCE TO RELATED APPLICATIONS

This patent application claims the benefit of U.S. Provisional Patent Application Ser. No. 61/384,407 filed on Sep. 20, 2010, and entitled "Annealing Thin Films." The disclosure of the aforementioned Provisional Patent Application Ser. No. 61/384,407 is expressly incorporated herein by reference in its entirety for all purposes.

FIELD OF THE INVENTION

The present invention relates to the physical sciences, and, more particularly, to annealing techniques and the like.

BACKGROUND OF THE INVENTION

Currently, copper indium gallium (di)selenide, also known as Cu2InGa(S, Se)4 or CIGS; and cadmium telluride (CdTe) are the major materials developed for use in thin film solar cells. With regard to the CIGS material, the prices of indium and gallium are high. Due to increasing demand in recent years for indium tin oxide (ITO) for use in flat panel displays, the price of indium continues to increase. With regard to CdTe, cadmium is toxic and tellurium is quite rare.

SUMMARY OF THE INVENTION

Principles of the invention provide techniques for annealing thin films; for example, for annealing $Cu_2ZnSn(S_xSe_{4-x})$, where x varies from zero to four, thin films ("CZTSSe" or Kesterite) with top caps for solar cell applications.

In one aspect, an exemplary method includes the step of providing a Kesterite film on a substrate. The Kesterite film and the substrate are generally planar, have an interface, and have a substrate exterior side and a Kesterite exterior side. An additional step includes locating the cap adjacent the Kesterite exterior side. A further step includes applying sufficient heat to the Kesterite film and the substrate for a sufficient time to anneal the Kesterite film. The annealing is carried out with the cap adjacent the Kesterite exterior side.

In another aspect, an exemplary method includes the step of forming a Kesterite film on a substrate. The Kesterite film and the substrate are generally planar, have an interface, and have a substrate exterior side and a Kesterite exterior side. An additional step includes locating the cap adjacent the Kesterite exterior side. A further step includes applying sufficient heat to the Kesterite film and the substrate for a sufficient time to anneal the Kesterite film. The annealing is carried out with the cap adjacent the Kesterite exterior side. Additional steps include growing an emitter layer on the Kesterite exterior side, subsequent to the annealing; depositing a transparent conduction oxide layer on the emitter layer; depositing a top metal contact on the transparent conduction oxide layer; and carrying out device isolation to obtain a plurality of solar cells.

In still another aspect, an exemplary method includes the step of providing a film of thin-film solar cell material on a substrate. The film and the substrate are generally planar, have an interface, and have a substrate exterior side and a film exterior side. Additional steps include locating the cap adjacent the film exterior side; and applying sufficient heat to the film and the substrate for a sufficient time to anneal the film. The annealing is carried out with the cap adjacent the film exterior side. In the locating step and applying step, the cap is employed without any precursor layer thereon.

In a further aspect, an exemplary method includes the step of forming a film of thin-film solar cell material on a substrate. The film and the substrate are generally planar, have an interface, and have a substrate exterior side and a film exterior side. Additional steps include locating the cap adjacent the film exterior side; and applying sufficient heat to the film and the substrate for a sufficient time to anneal the film. The annealing is carried out with the cap adjacent the film exterior side. In the locating step and applying steps, the cap is employed without any precursor layer thereon. Additional steps include growing an emitter layer on the film exterior side, subsequent to the annealing; depositing a transparent conduction oxide layer on the emitter layer; depositing a top metal contact on the transparent conduction oxide layer; and carrying out device isolation to obtain a plurality of solar cells. In the locating step and applying steps, the cap is employed without any precursor layer thereon.

As used herein, "facilitating" an action includes performing the action, making the action easier, helping to carry the action out, or causing the action to be performed. Thus, by way of example and not limitation, instructions executing on one processor might facilitate an action carried out by a piece of manufacturing or test equipment or instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof (for example, computer control of an annealing or related manufacturing or test process) can be implemented in the form of a computer product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s), or (iii) a combination of hardware and software modules; any of (i)-(iii) implement the specific techniques set forth herein, and the software modules are stored in a computer-readable storage medium (or multiple such media).

Techniques of the present invention can provide substantial beneficial technical effects. For example, one or more embodiments may provide one or more of the following advantages:

large grain size and/or a smooth film
reduce or eliminate loss of S, Sn, and/or Se
avoid formation of voids in the film, especially near the Mo-CZTS interface
Avoid phase separation formation of Se-rich and Se-poor phases These and other features and advantages of the present invention will become apparent from the following detailed description of illustrative embodiments thereof, which is to be read in connection with the accompanying drawings.

DETAILED DESCRIPTION OF PREFERRED EMBODIMENTS

As noted, currently, copper indium gallium (di)selenide, also known as Cu2InGa(S, Se)4 or CIGS; and cadmium telluride (CdTe) are the major materials developed for use in thin film solar cells. With regard to the CIGS material, the prices of indium and gallium are high. Due to increasing demand in recent years for indium tin oxide (ITO) for use in flat panel displays, the price of indium continues to increase. With regard to CdTe, cadmium is toxic and tellurium is quite rare.

Kesterite, also known as $Cu_2ZnSnS_xSe_{4-x}$ or CZTS, holds the promise of low-cost, renewable solar cells, since all the elements used are cheap and earth-abundant. Costs may be lower, since CZTS is indium- and gallium-free; furthermore, less concern with toxicity is anticipated due to absence of cadmium and tellurium. CZTS films have been deposited by various techniques, including thermal evaporation, solution processes, electroplating, sputtering, and the like.

Figure 1:
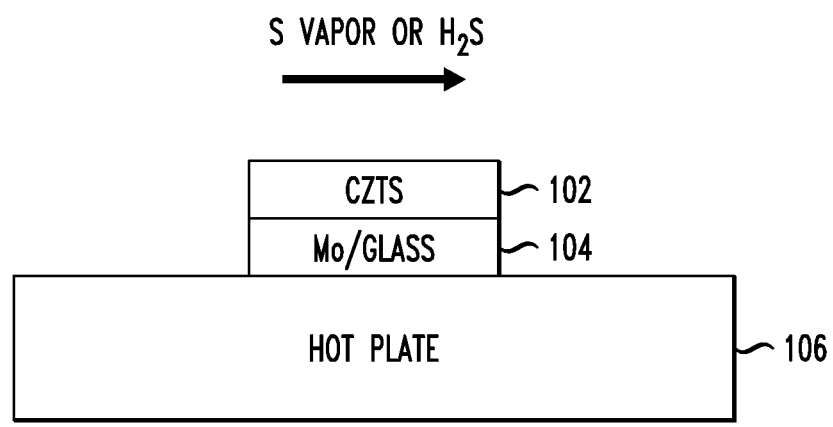
FIG. 1 shows a traditional annealing method, according to the prior art.

Most fabrication flows require high temperature annealing (>500° C.) to grow large grains for the CZTS absorber layer. Commonly used methods for high temperature annealing include annealing in a furnace with flowing $H_2S$ gas, and annealing inside a sealed tube with sufficient S vapor pressure. Such methods may exhibit issues with one or more of temperature uniformity; loss of Sn, S, and/or Se at high temperature; surface smoothness; and grain size control. Furthermore, they typically require a long time for the annealing process, e.g. at annealing temperature from 1-3 hours and with an extra 1-3 hours cooling down time. One or more embodiments of the invention only take 5 minutes annealing time with 10-30 minutes cooling down time. In general, for annealing, a functional or workable range is from about 3-20 minutes, preferably about 5-10 minutes; and for cooling down, a workable range is from about 10-30 minutes, preferably about 10-15 minutes. Refer to the traditional annealing process of FIG. 1, wherein CZTS 102 is deposited on molybdenum coated glass 104 situated on hot plate 106 and annealing is carried out at high temperature with the CZTS exposed to S vapor or $H_2S$ gas.

Figure 5:
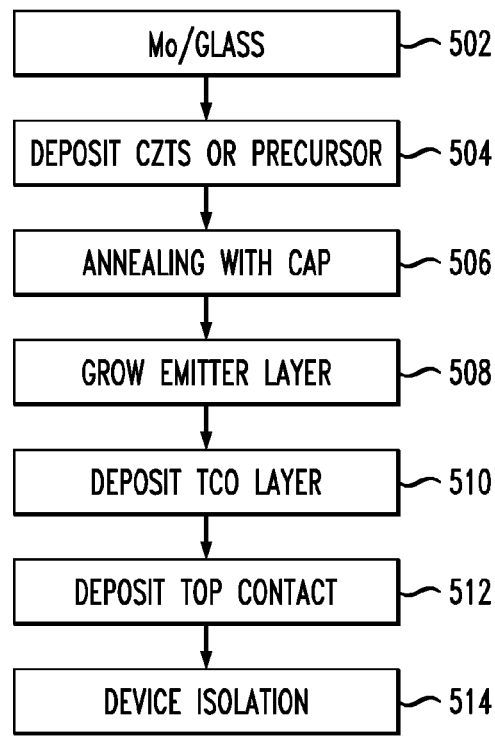
FIG. 5 depicts exemplary process flow, according to an aspect of the invention.
Figure 7:
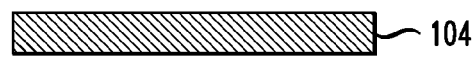
FIGS. 7-12 show layers and/or structures corresponding to certain steps in FIG. 5.
Figure 8:

One or more embodiments employ a reusable cap to assist CZTS high temperature annealing. As seen in FIGS. 5 & 7, in step 502, a suitable substrate 104 can be provided; for example, molybdenum coated glass (Mo/glass), a metal film, aluminum foil, stainless steel, or the like, graphite, transparent conducting oxide layer such as ITO, Zn, or any metal deposited on flexible substrate. In step 504 (see also FIG. 8), deposit CZTS 102 or a precursor on substrate 104; deposition may be carried out, for example, via evaporation, sputtering, electrical plating, a solution process, or the like. Again, the film can be deposited by various methods, including thermal evaporation, a solution process, electroplating, e-beam deposition, and sputtering. The film may come in a single element formation, such as pure Cu, Zn, Sn, S, Se, or as compounds such as CuS, ZnS, SnS, CuSe, ZnSe, SnSe, $Cu_2ZnSnS_xSe_{4-x}$, or the like. For example, the film may be provided as a Cu/Zn/Sn/S/Se stacked or mixed layer; electroplated deposit of Cu/Zn/Sn/S/Se film; a stack of Cu/Zn/Sn without S or Se; or the like. In a solution process it is possible to deposit, for example, CuSe, ZnSe, SnSe precursor or the like.

Figure 2:
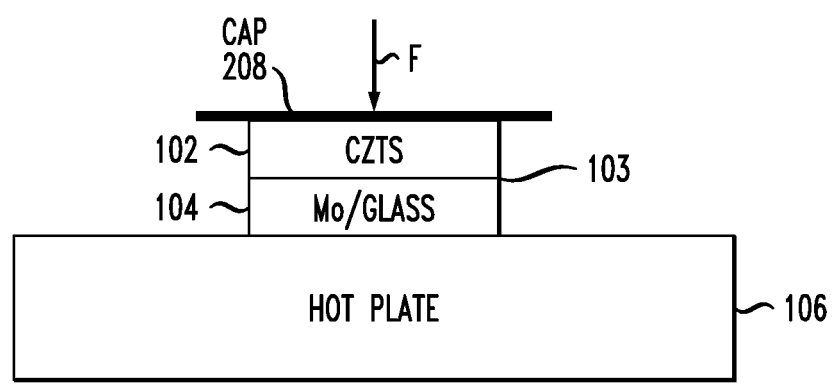
FIG. 2 shows an annealing method according to an aspect of the invention.

In step 506, carry out an annealing process employing a cap 208, as illustrated in FIG. 2. CZTS film 102 is covered with the reusable cap 208 during annealing. There is no need for flowing S vapor or $H_2S$ gas. In the film 102, in one or more embodiments, Cu, Zn, and Sn are deposited with the correct composition, and S and Se can be added in a greater than stoichiometric composition. In some cases, additional S and/or Se can be deposited to the cap layer to supply additional S and/or Se.

The cover or cap 208 can be, for example, any semiconductor wafer (such as Si), quartz or high temperature glass, or the like. In some instances, a suitable force F (for example, from a weight) can be applied to the cap to assist annealing (force can be applied, for example, as a pressure distributed over the cap).

Figure 9:
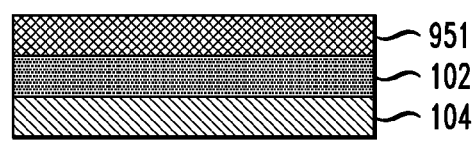
Figure 10:
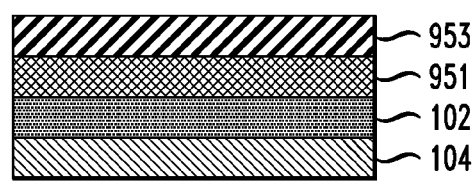
Figure 11:
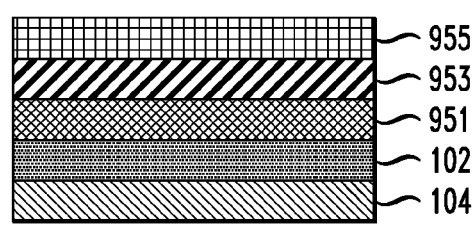

After annealing, solar cell devices can be made using transition fabrication steps, including growing an emitter layer 951 of CdS or other material, in step 508 (see also FIG. 9); depositing a Transparent Conduction Oxide (TCO) layer 953 in step 510 (see also FIG. 10); depositing a top metal contact 955 in step 512 (see also FIG. 11); and device isolation, in step 514.

Figure 12:
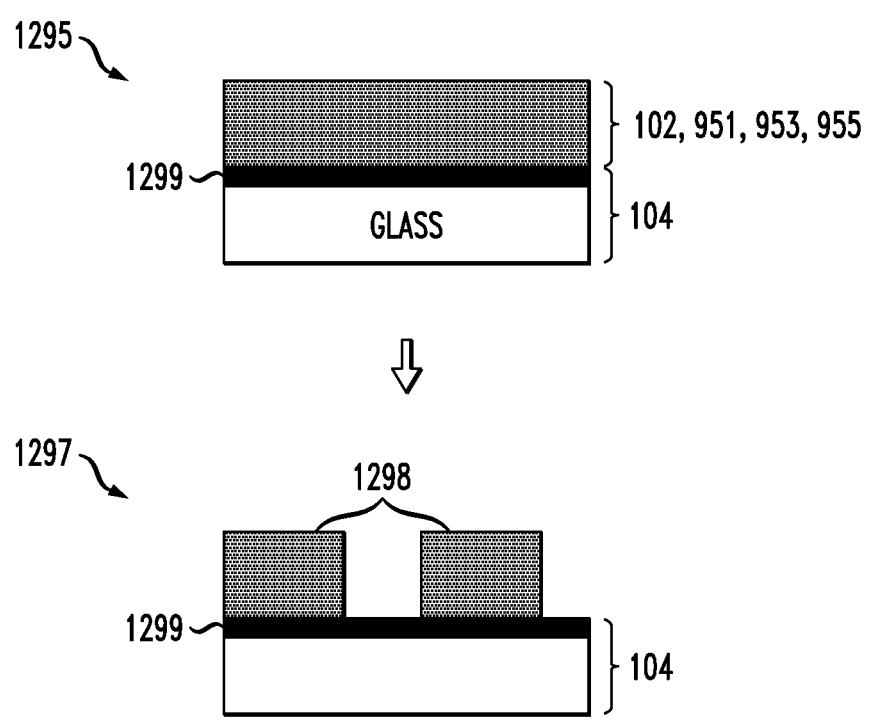

For the device isolation step 514, suitable methods include, for example: (1) mechanical scribing and (2) laser scribing. Refer to FIG. 12, which depicts device isolation by scribing, such as, for example, mechanical scribing or laser scribing. Mechanical scribing can be done with various metal blades, such as stainless steel. CZTS,Se is a soft material and can be easily removed physically without damaging the Mo substrate. For the laser scribing, the laser photon energy should be higher than the band gap energy of the CZTS,Se film. For example, a green laser at a wavelength of 532 nm is a good choice to scribe CZTS,Se film. A typical working range for laser power is 0.05-10 $J/cm^2$. The actual power used depends on the laser wavelength and laser pulse duration. In FIG. 12, the top 1295 shows a molybdenum coated glass substrate (104 with molybdenum coating 1299) with the other layers 102, 951, 953, 955 described with respect to FIGS. 9-11 and shown as a single layer purely for illustrative convenience. The bottom 1297 of FIG. 12 shows the result after scribing to isolate the devices 1298.

Figure 3:
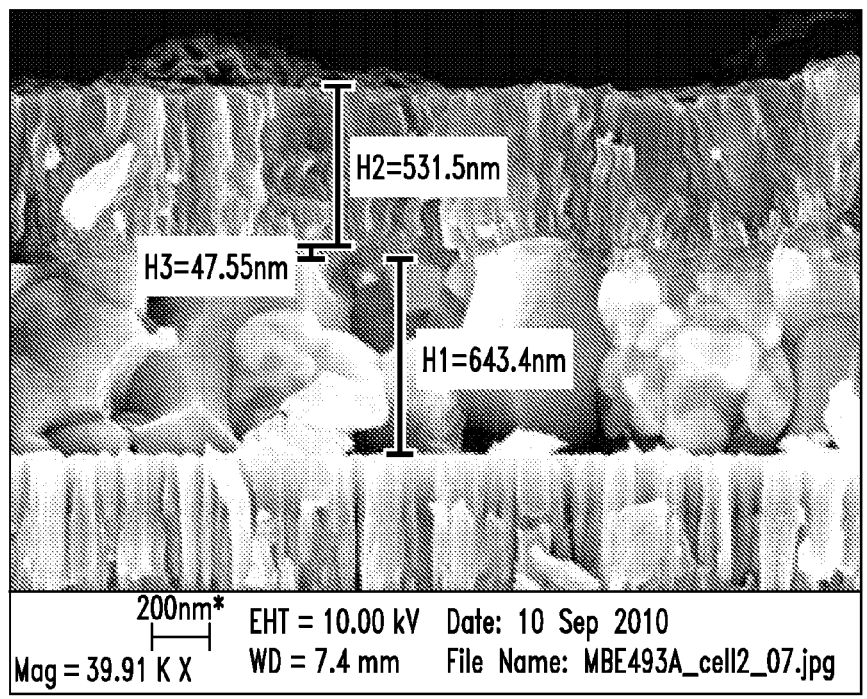
FIG. 3 shows a scanning electron microscope image of a $Cu_2ZnSnS_xSe_{4-x}$ sample annealed using a method in accordance with an aspect of the invention.
Figure 4:
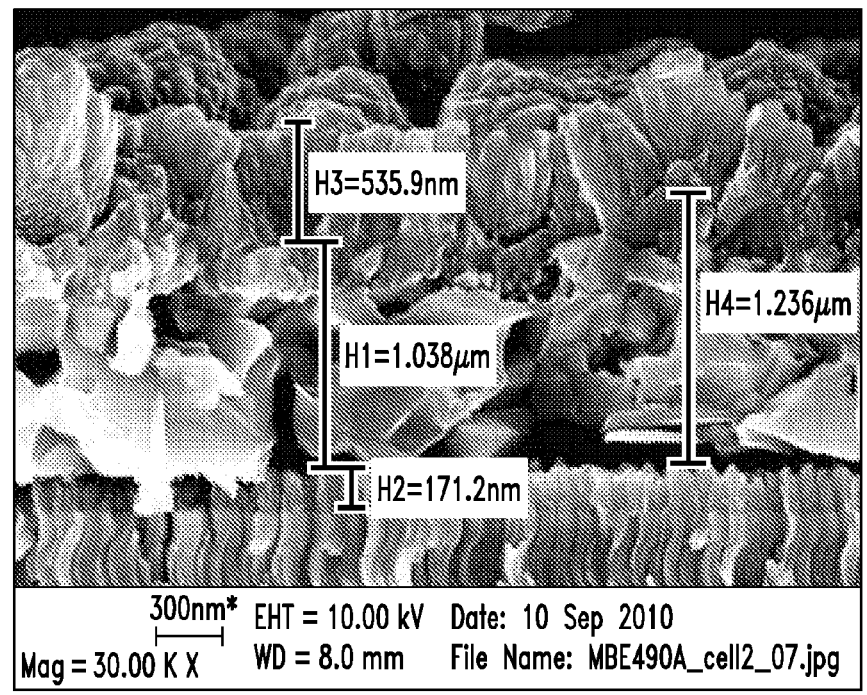
FIG. 4 shows a scanning electron microscope image of a $Cu_2ZnSnS_xSe_{4-x}$ sample annealed using the traditional method.

Non-limiting exemplary experimental results will now be discussed; it is to be emphasized that other embodiments may have similar or different results. FIGS. 3 and 4 show cross sections of two $Cu_2ZnSnS_xSe_{4-x}$ samples annealed with different methods. FIG. 4 was annealed with the traditional method illustrated in FIG. 1, while FIG. 3 was annealed using a cap as illustrated in FIG. 2. Advantageously, in this example, using the technique with the cap results in larger grain size, fewer voids, a smooth surface, and no Se loss. Furthermore, the grain structure achieved with the cap technique has been found to be quite repeatable.

The annealing was carried out in a glove box filled with pure nitrogen gas; a suitable inert gas, such as pure nitrogen gas or argon gas, can be used in the general case. Oxygen and Water were limited to below 0.1 ppm in the example; in general, below 0.1 ppm is preferable, but up to 1 ppm is workable although not preferred. Samples were heated up to 540° C. for 5 minutes and then allowed to cool down to room temperature. Before annealing, the grain size was <50 nm, and after annealing, the grain size was typically above 500 nm. All values are illustrative and not intended to be limiting.

| Method | Se/(Se + S) before annealing | Se/(Se + S) after annealing | Device Efficiency | XRD |
|---|---|---|---|---|
| FIG. 3, with cap | 0.85 | 0.85 | Above 3% | No phase separation |
| FIG. 4, traditional | 0.85 | 0.45 | 1-2% | phase separation |

Using X-ray florescence (XRF), the composition change with the different annealing methods has been verified. When using the traditional annealing method, the Se/(Se+S) ratio dropped from 0.85 to 0.45, indicating a significant loss of Se. With the cap annealing method, there is no Se loss.

X-ray diffraction (XRD) results show that CZTS with the traditional annealing method will have a phase separation problem: there exist some Se-rich and some Se-poor phases in the film, which is bad for device performance. While using the annealing technique with a cap, one single phase can be achieved.

In terms of device performance, the CZTS solar cell annealed with a cap showed significantly improved efficiency (3%) compared to the traditional annealing method (1-2%) under 1 Sun illumination.

By way of provision of additional non-limiting illustrative experimental data, a comparison will be provided for CZTS, Se annealed with different methods. Two samples were compared here; sample A was annealed with a cap, and sample B was annealed with the traditional method using pure S and Se mixed vapor. The table below illustrates the composition change before and after annealing. The composition was measured by X-ray Fluorescence (XRF) spectroscopy.

| | Before annealing (%) | | | | | After annealing (%) | | | | |
|---|---|---|---|---|---|---|---|---|---|---|
| Sample | Cu | Zn | Sn | S* | Se | Cu | Zn | Sn | S* | Se |
| A | 21.7 | 16.8 | 11.4 | 6 | 44 | 21.6 | 17.1 | 11.2 | 5 | 45 |
| B | 22.7 | 15.6 | 11.7 | 7 | 43 | 23.4 | 16 | 10.5 | 27 | 23 |

*S estimated assuming (Cu + Zn + Sn)/(S + Se)~1

It can be seen that when annealing with a cap, the composition does not change much before and after high temperature annealing. However, when using traditional annealing, the composition change is more and Se loss is significant.

Figure 13:
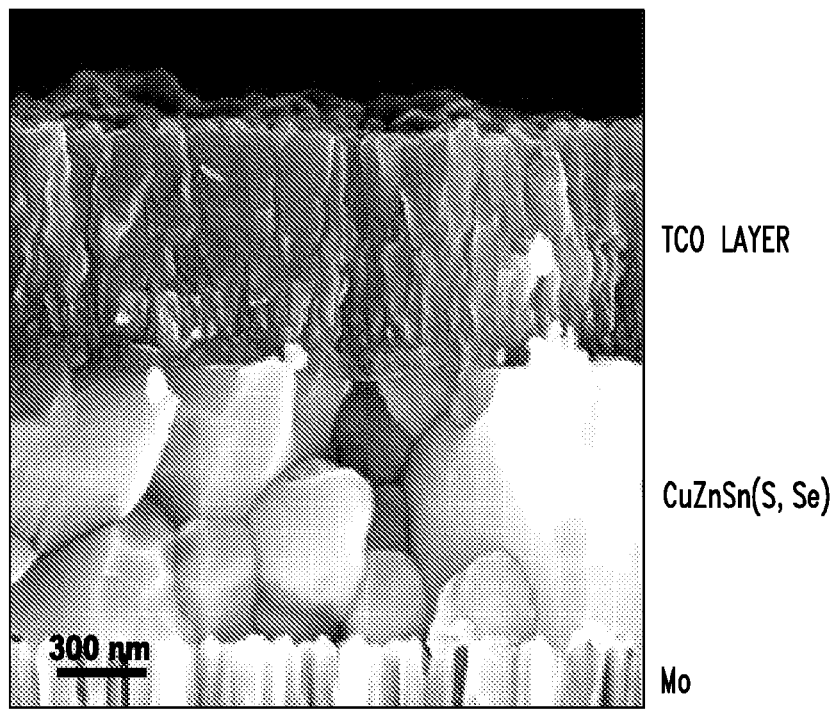
FIG. 13 shows a sample annealed using a cap method in accordance with an aspect of the invention.
Figure 14:
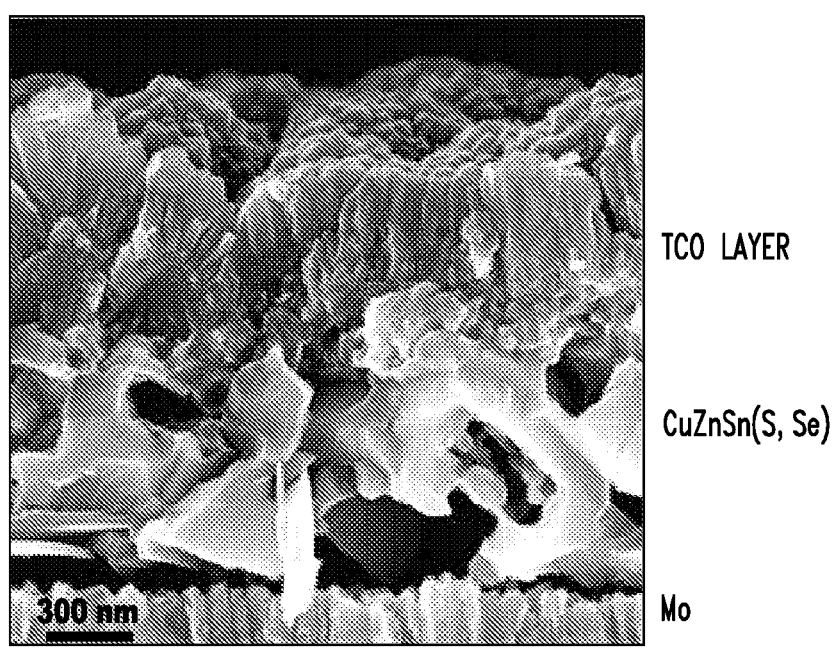
FIG. 14 shows a sample annealed using a traditional method.

FIGS. 13 and 14 show the cross section of two $Cu_2ZnSnS_xSe_{4-x}$ samples annealed with different methods (FIG. 13 using cap and FIG. 14 using traditional method). It can be seen that in this instance, using an exemplary inventive method with a cap, larger grain size, fewer voids, and a smooth surface have been achieved.

Figure 15:
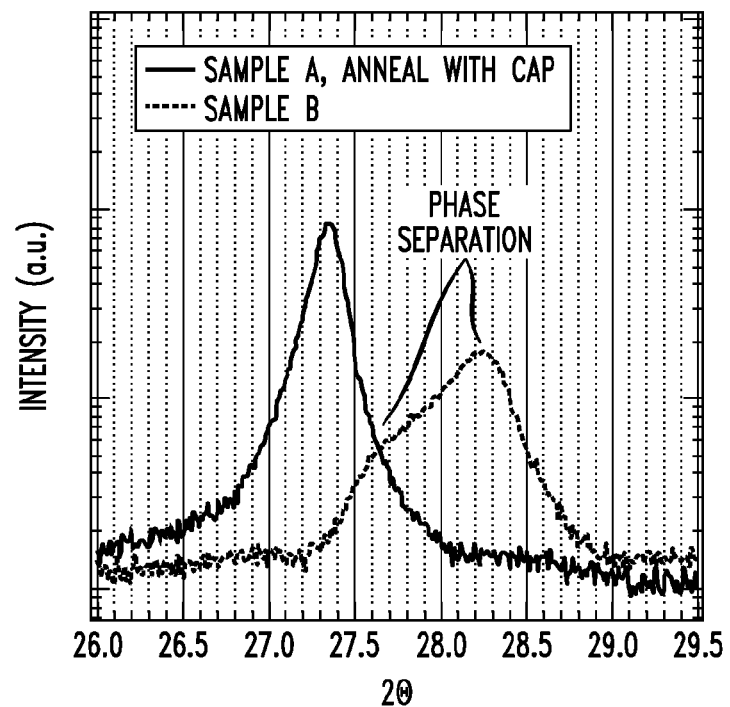
FIG. 15 depicts an X-ray diffraction result.

The crystal structure was examined using X-ray diffraction (XRD) as shown in FIG. 15. Sample B, which was annealed using traditional S/Se vapor, exhibits a broadened peak and phase separation, indicating poor crystal quality. However, sample A, annealed with a cap, showed a sharper peak with a single phase.

Figure 16:
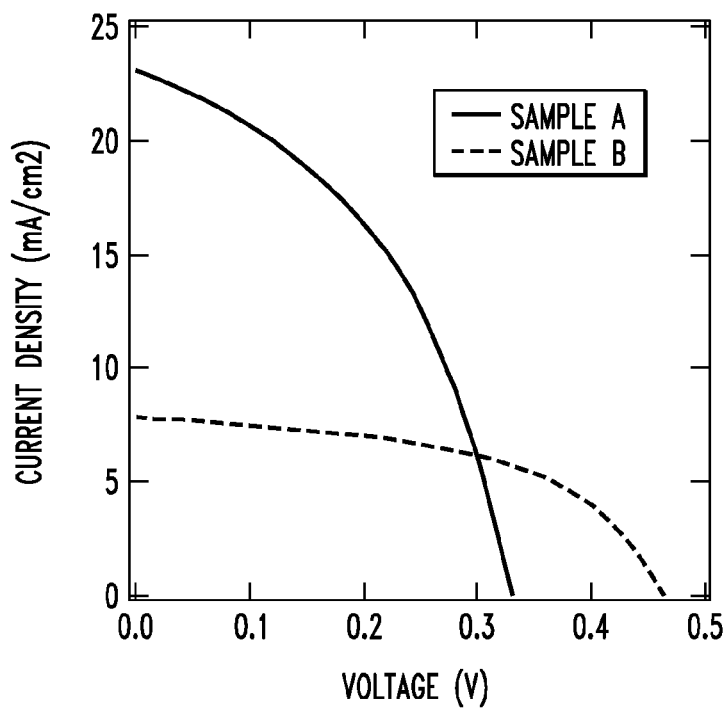
FIG. 16 shows solar cell device measurement: light IV under AM1.5G.

In an experiment, solar cell devices were made using CZTS,Se annealing with both methods. They had the same device structure and dimensions. The solar cell device characterization is shown in FIG. 16. The light J-V (current density vs. voltage) was measured with a solar simulator with light intensity and spectrum calibrated to simulate AM1.5G spectrum. Sample A showed an efficiency of 3.3%, and sample B had an efficiency of 1.9%. A pertinent thing to point out is that due to more Se incorporation in sample A, the short circuit current is about 23.1 $mA/cm^2$, which is significantly improved as compared to sample B, which had 7.8 $mA/cm^2$. The skilled artisan will be familiar with the AM1.5G spectrum from ASTM G-173-03, which is nevertheless expressly incorporated herein by reference in its entirety for al purposes.

One or more embodiments advantageously provide fast, high-temperature annealing resulting in a large grain size and/or smooth film; reduction or elimination of loss of S, Sn, and/or Se; and/or reducing or eliminating formation of voids in the film, especially near the substrate-CZTS interface. Examples of suitable materials for the cap include silicon and quartz, which advantageously reduces or eliminates introduction of impurities. In some cases, S or Se beyond the stoichiometric amount can be introduced.

Advantageously, in one or more embodiments, no precursor layer needs to be deposited on the cap.

One or more embodiments provide better control of high temperature annealing for thin film solar cells, especially those employing CZTS. Formation of large grains of CZTS and avoiding loss of S and/or Se are possible with one or more embodiments, allowing high efficiency solar cells. Advantageously, one or more embodiments avoid loss of S, Se, and/or Sn encountered in prior art direct high-temperature annealing techniques. Furthermore, one or more embodiments avoid use of toxic $H_2S$ gas as in current techniques. Still further, one or more embodiments do not suffer from difficulty in controlling annealing with extra S or Se in the ambient, which may be encountered in current techniques, especially for large scale devices.

Thus, one or more embodiments anneal a thin film solar cell with a cap on top, achieving one or more of good grain structure, uniform surface, and retention of S and/or Se in the film.

Given the discussion thus far, it will be appreciated that, in general terms, an exemplary method (for example, for annealing) includes providing a Kesterite film 102 on a substrate such as 104. The Kesterite film 102 and the substrate 104 are generally planar, have an interface 103, and have a substrate exterior side (adjacent hot plate 106) and a Kesterite exterior side (adjacent cap 208). An additional step includes locating the cap 208 adjacent the Kesterite exterior side. A further step includes applying sufficient heat to the Kesterite film and the substrate for a sufficient time to anneal the Kesterite film. The annealing is carried out with the cap adjacent the Kesterite exterior side.

In some instances, the annealing is carried out in a glove box filled with pure nitrogen gas, and Oxygen and Water are limited to below 0.1 ppm. In one or more embodiments, annealing is carried out in an environment with inert gas, such as Nitrogen or Argon gas, and presence of water and oxygen is preferably avoided.

In one or more embodiments, samples are heated above 400° C. (540° C. in a non-limiting example), for 5 minutes and then allowed to cool down to room temperature. The heating can be carried out, for example, by: 1) using a rapid thermal annealing (RTP) to heat the substrate, or 2) directly putting the sample on a pre-heated hot plate. In at least some instances, the cooling time or ramping down rate is not especially significant.

Experiments have been conducted on a glass substrate up to 5 inches×5 inches (about 13 cm×13 cm) using RTP or hot plate annealing. Standard glass substrate thicknesses are 1 mm or 3 mm. The glass can be as thick as, for example, tens of mm for large panels to provide adequate structural support. Typical Mo thickness is 500 nm to 3 micron, but these values are exemplary and not limiting. Mo thickness around 1 micron is preferred.

For the CZTS,Se film, a typical thickness range is 300 nm to 10 micron, but this range is exemplary and non-limiting; in some cases, the range limited to 600 nm to 2.5 micron is preferred.

In one or more non-limiting embodiments, before annealing, the grain size is <50 nm, and after annealing, the grain size is typically from 300 nm to 1 or 2 micron. Grain size larger than 500 nm is preferred.

As noted, in some instances, a force is applied to the cap during the annealing; for example, via placing a weight on top. The pressure can be applied up to a limit without cracking the substrate. A typical exemplary, non-limiting pressure range that can be applied is 10-100 Pascals. To apply a uniform pressure, the weight can be a glass or quartz substrate with the same size as the solar cell, and then by varying the thickness of the glass or quartz, different pressures can be applied (since thicker weights will weigh more and thus apply more pressure).

In one or more embodiments, the application of heat includes applying the heat directly to the substrate 104 via contact (e.g., contact with hot plate 106). In such cases, the heat is applied indirectly to the Kesterite film 102 via conduction through the substrate 104.

As noted, non-limiting examples of a suitable cap material include silicon and quartz. Significant requirements for a suitable cap are:

High melting temperature (>1000 C preferable)
Less thermal expansion than glass or CZTS,Se in the temperature range from room temperature to 800° C.
Less impurities than quartz inside the cap to avoid diffusion
Smooth surface, such as polished Si wafer, or glass with surface quality 60/40

In one or more embodiments, in the locating step and applying steps, the cap 208 is employed without any precursor layer thereon.

Furthermore, given the discussion thus far, it will be appreciated that, in general terms, an exemplary method (for example, for manufacturing solar cells) includes forming a Kesterite film 102 on a substrate such as 104. The Kesterite film 102 and the substrate 104 are generally planar, have an interface 103, and have a substrate exterior side (adjacent hot plate 106) and a Kesterite exterior side (adjacent cap 208). An additional step includes locating the cap 208 adjacent the Kesterite exterior side. A further step includes applying sufficient heat to the Kesterite film and the substrate for a sufficient time to anneal the Kesterite film. The annealing is carried out with the cap adjacent the Kesterite exterior side.

Additional steps include growing an emitter layer on the Kesterite exterior side, subsequent to the annealing, as at 508; depositing a transparent conduction oxide layer on the emitter layer, as at 510; depositing a top metal contact on the transparent conduction oxide layer, as at 512; and carrying out device isolation to obtain a plurality of solar cells, as at 514.

In one or more embodiments, in the locating step and applying steps, the cap 208 is employed without any precursor layer thereon.

The comments just above, on the annealing process, regarding application of force, application of heat, and cap materials are equally applicable to the manufacturing method.

Even further, given the discussion thus far, it will be appreciated that, in general terms, an exemplary method (for example, for annealing) includes providing a film of thin-film solar cell material (102 is a non-limiting example) on a substrate 104. The film could be CZTS any other suitable material, non-limiting examples of which have been provided herein. The film and the substrate are generally planar, have an interface 103, and have a substrate exterior side (adjacent hot plate 106) and a film exterior side (adjacent cap 208). Additional steps include locating the cap 208 adjacent the film exterior side; and applying sufficient heat to the film and the substrate for a sufficient time to anneal the film. The annealing is carried out with the cap adjacent the film exterior side. In the locating step and applying steps, the cap is employed without any precursor layer thereon.

The comments above, on the annealing process with the Kesterite film, regarding application of force, application of heat, and cap materials are equally applicable to the just-discussed annealing process.

Yet further, given the discussion thus far, it will be appreciated that, in general terms, an exemplary method (for example, for manufacturing solar cells) includes forming a film of thin-film solar cell material (102 is a non-limiting example) on a substrate 104. The film could be CZTS any other suitable material, non-limiting examples of which have been provided herein. The film and the substrate are generally planar, have an interface 103, and have a substrate exterior side (adjacent hot plate 106) and a film exterior side (adjacent cap 208). Additional steps include locating the cap 208 adjacent the film exterior side; and applying sufficient heat to the film and the substrate for a sufficient time to anneal the film. The annealing is carried out with the cap adjacent the film exterior side. In the locating step and applying steps, the cap is employed without any precursor layer thereon.

Additional steps include growing an emitter layer on the film exterior side, subsequent to the annealing, as at 508; depositing a transparent conduction oxide layer on the emitter layer, as at 510; depositing a top metal contact on the transparent conduction oxide layer, as at 512; and carrying out device isolation to obtain a plurality of solar cells, as at 514.

The comments above, on the annealing process with the Kesterite film, regarding application of force, application of heat, and cap materials are equally applicable to the just-discussed manufacturing process.

One or more methods, techniques, and/or processes as described above can be used, for example, in the fabrication of products such as solar cells and the like.

Exemplary System and Article of Manufacture Details

As will be appreciated by one skilled in the art, aspects (e.g., for controlling an annealing, manufacturing or testing process) of the present invention may be embodied as a system, method or computer program product. Accordingly, certain portions of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

One or more embodiments of portions of the invention, or elements thereof, can be implemented in the form of an apparatus including a memory and at least one processor that is coupled to the memory and operative to perform or otherwise facilitate exemplary method steps.

Figure 6:
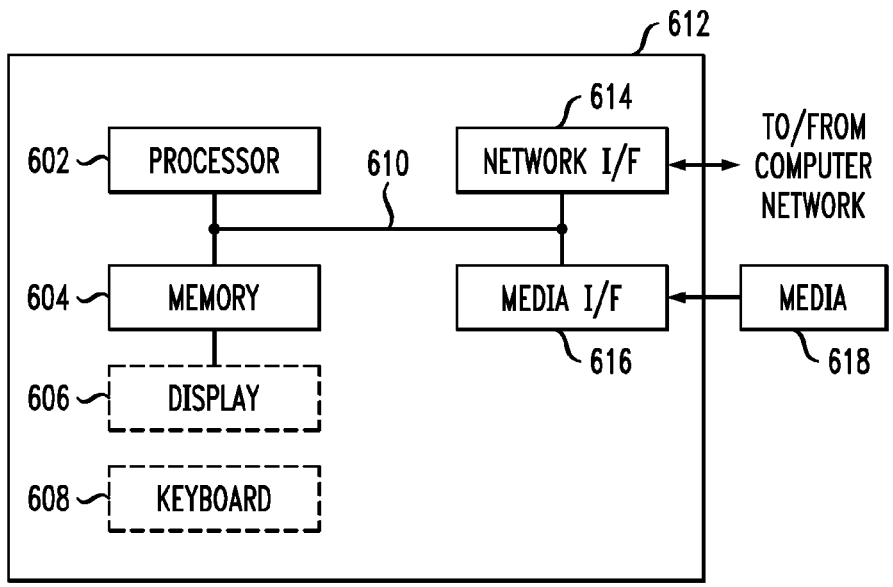
FIG. 6 depicts a computer system that may be useful in implementing one or more aspects and/or elements of the invention.

One or more embodiments can make use of software running on a general purpose computer or workstation. With reference to FIG. 6, such an implementation might employ, for example, a processor 602, a memory 604, and an input/output interface formed, for example, by a display 606 and a keyboard 608. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the phrase "input/output interface" as used herein, is intended to include, for example, one or more mechanisms for inputting data to the processing unit (for example, mouse), and one or more mechanisms for providing results associated with the processing unit (for example, printer). The processor 602, memory 604, and input/output interface such as display 606 and keyboard 608 can be interconnected, for example, via bus 610 as part of a data processing unit 612. Suitable interconnections, for example via bus 610, can also be provided to a network interface 614, such as a network card, which can be provided to interface with a computer network, and to a media interface 616, such as a diskette or CD-ROM drive, which can be provided to interface with media 618.

Provision can be made to interface with sensors (e.g., pressure, force, temperature), actuators, and the like, for control of an annealing, manufacturing, and/or testing process or any portion thereof.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 602 coupled directly or indirectly to memory elements 604 through a system bus 610. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 608, displays 606, pointing devices, and the like) can be coupled to the system either directly (such as via bus 610) or through intervening I/O controllers (omitted for clarity).

Network adapters such as network interface 614 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 612 as shown in FIG. 6) running a server program. It will be understood that such a physical server may or may not include a display and keyboard.

As noted, aspects of the present invention may take the form of a computer program product embodied in one or more computer readable medium(s) having computer readable program code embodied thereon. Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. Media block 618 is a non-limiting example. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, modules to carry out, control, and/or facilitate any annealing, manufacturing, or testing as described herein (e.g., control an annealing heat source and/or cool-down phase as to time and/or temperature). The method steps can then be carried out using the distinct software modules and/or sub-modules of the system, as described above, executing on one or more hardware processors 602. Further, a computer program product can include a computer-readable storage medium with code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
providing a Kesterite film on a substrate, said Kesterite film and said substrate being generally planar, having an interface, and having a substrate exterior side and a Kesterite exterior side;
locating a cap adjacent said Kesterite exterior side; and
applying sufficient heat to said Kesterite film and said substrate for a sufficient time to anneal said Kesterite film, said annealing being carried out with said cap adjacent said Kesterite exterior side.

2. The method of claim 1, further comprising applying a force to said cap during said annealing.

3. The method of claim 1, wherein said applying of said heat comprises applying said heat directly to said substrate via contact, said heat being applied indirectly to said Kesterite film via conduction through said substrate.

4. The method of claim 1, wherein, in said locating step, said cap comprises one of silicon and quartz.

5. The method of claim 1, wherein, in said locating step and applying steps, said cap is employed without any precursor layer thereon.

6. The method of claim 1, wherein:
said sufficient time ranges from about three to about twenty minutes; and
said annealing is carried out in an inert gas environment.

7. The method of claim 6, wherein said sufficient time ranges from about five to about ten minutes.

8. A method comprising:
forming a Kesterite film on a substrate, said Kesterite film and said substrate being generally planar, having an interface, and having a substrate exterior side and a Kesterite exterior side;
locating a cap adjacent said Kesterite exterior side;
applying sufficient heat to said Kesterite film and said substrate for a sufficient time to anneal said Kesterite film, said annealing being carried out with said cap adjacent said Kesterite exterior side;
growing an emitter layer on said Kesterite exterior side, subsequent to said annealing;
depositing a transparent conduction oxide layer on said emitter layer;
depositing a top metal contact on said transparent conduction oxide layer; and
carrying out device isolation to obtain a plurality of solar cells.

9. The method of claim 8, further comprising applying a force to said cap during said annealing.

10. The method of claim 8, wherein said applying of said heat comprises applying said heat directly to said substrate via contact, said heat being applied indirectly to said Kesterite film via conduction through said substrate.

11. The method of claim 8, wherein, in said locating step, said cap comprises one of silicon and quartz.

12. The method of claim 8, wherein, in said locating step and applying steps, said cap is employed without any precursor layer thereon.

13. The method of claim 8, wherein:
said sufficient time ranges from about three to about twenty minutes; and
said annealing is carried out in an inert gas environment.

14. The method of claim 13, wherein said sufficient time ranges from about five to about ten minutes.

15. A method comprising:
providing a film of thin-film solar cell material comprising copper, zinc, tin and at least one of sulfur and selenium on a substrate, said film and said substrate being generally planar, having an interface, and having a substrate exterior side and a film exterior side;
locating a cap adjacent said film exterior side; and
applying sufficient heat to said film and said substrate for a sufficient time to anneal said film, said annealing being carried out with said cap adjacent said film exterior side;
wherein, in said locating step and applying steps, said cap is employed without any precursor layer thereon.

16. The method of claim 15, further comprising applying a force to said cap during said annealing.

17. The method of claim 15, wherein said applying of said heat comprises applying said heat directly to said substrate via contact, said heat being applied indirectly to said film via conduction through said substrate.

18. The method of claim 15, wherein, in said locating step, said cap comprises one of silicon and quartz.

19. The method of claim 15, wherein:
said sufficient time ranges from about three to about twenty minutes; and
said annealing is carried out in an inert gas environment.

20. The method of claim 19, wherein said sufficient time ranges from about five to about ten minutes.

21. A method comprising:
forming a film of thin-film solar cell material on a substrate, said film and said substrate being generally planar, having an interface, and having a substrate exterior side and a film exterior side;
locating a cap adjacent said film exterior side;
applying sufficient heat to said film and said substrate for a sufficient time to anneal said film, said annealing being carried out with said cap adjacent said film exterior side;
growing an emitter layer on said film exterior side, subsequent to said annealing;
depositing a transparent conduction oxide layer on said emitter layer;
depositing a top metal contact on said transparent conduction oxide layer; and
carrying out device isolation to obtain a plurality of solar cells;
wherein, in said locating step and applying steps, said cap is employed without any precursor layer thereon.

22. The method of claim 21, further comprising applying a force to said cap during said annealing.

23. The method of claim 21, wherein said applying of said heat comprises applying said heat directly to said substrate via contact, said heat being applied indirectly to said film via conduction through said substrate.

24. The method of claim 21, wherein, in said locating step, said cap comprises one of silicon and quartz.

25. The method of claim 21, wherein:
said sufficient time ranges from about three to about twenty minutes; and
said annealing is carried out in an inert gas environment.

26. The method of claim 21, wherein the thin-film solar cell material comprises copper, zinc, tin and at least one of sulfur and selenium.

27. A method comprising:
providing a film of thin-film solar cell material on a substrate, said film and said substrate being generally planar, having an interface, and having a substrate exterior side and a film exterior side;
locating a cap adjacent said film exterior side; and
applying sufficient heat to said film and said substrate for a sufficient time to anneal said film, said annealing being carried out with said cap adjacent said film exterior side;
applying a force to said cap during said annealing, and
wherein, in said locating step and applying steps, said cap is employed without any precursor layer thereon.

* * * * *